US012590234B2

(12) United States Patent
Zhou

(10) Patent No.: US 12,590,234 B2
(45) Date of Patent: Mar. 31, 2026

(54) ADHESIVE COMPOSITIONS, LAYERED ARTICLES AND PHOTOVOLTAIC SHEETS

(71) Applicant: Bostik SA, Colombes (FR)

(72) Inventor: Hengshi Zhou, Shanghai (CN)

(73) Assignee: BOSTIK SA, Colombes (FR)

( * ) Notice: Subject to any disclaimer, the term of this patent is extended or adjusted under 35 U.S.C. 154(b) by 138 days.

(21) Appl. No.: 18/690,294

(22) PCT Filed: Sep. 19, 2022

(86) PCT No.: PCT/IB2022/000530
§ 371 (c)(1),
(2) Date: Mar. 8, 2024

(87) PCT Pub. No.: WO2023/047186
PCT Pub. Date: Mar. 30, 2023

(65) Prior Publication Data
US 2024/0425732 A1 Dec. 26, 2024

(30) Foreign Application Priority Data

Sep. 23, 2021 (EP) .................................... 21198596

(51) Int. Cl.
| | |
|---|---|
| *C09J 175/06* | (2006.01) |
| *B32B 7/12* | (2006.01) |
| *B32B 27/08* | (2006.01) |
| *B32B 27/32* | (2006.01) |
| *C08G 18/42* | (2006.01) |
| *C08G 18/73* | (2006.01) |
| *H10F 19/80* | (2025.01) |

(52) U.S. Cl.
CPC .............. *C09J 175/06* (2013.01); *B32B 7/12* (2013.01); *B32B 27/08* (2013.01); *B32B 27/322* (2013.01); *C08G 18/423* (2013.01); *C08G 18/73* (2013.01); *H10F 19/804* (2025.01); *B32B 2307/412* (2013.01); *B32B 2307/748* (2013.01); *B32B 2457/12* (2013.01)

(58) Field of Classification Search
CPC ........ C09J 175/06; H10F 19/804; B32B 7/12; B32B 27/08; B32B 27/322; C08G 18/423; C08G 18/73
See application file for complete search history.

(56) References Cited

U.S. PATENT DOCUMENTS

| | | | |
|---|---|---|---|
| 8,734,943 B2 | 5/2014 | Umino et al. | |
| 2011/0104482 A1* | 5/2011 | Yasui ..................... | C09J 175/06 428/343 |
| 2013/0309504 A1* | 11/2013 | Nakamura ............. | C09J 175/06 156/331.7 |

FOREIGN PATENT DOCUMENTS

| | | |
|---|---|---|
| EP | 2040306 A1 | 3/2009 |
| EP | 2218759 A1 | 8/2010 |
| EP | 3170878 A1 | 5/2017 |

OTHER PUBLICATIONS

ISA/EP: International Search Report and Written Opinion for International Patent Application No. PCT/IB2022/000530 dated Feb. 3, 2023, 11 pages.

* cited by examiner

*Primary Examiner* — Tae-Sik Kang
(74) *Attorney, Agent, or Firm* — Rimon P.C.; Allyn B. Elliott

(57) ABSTRACT

An adhesive composition which comprises a resin component (A) comprising a polyester polyol, a hydrogenated epoxy, a silane, and an optional organic solvent; and a hardener component (B) comprising an aliphatic polyisocyanate and/or an alicyclic polyisocyanate; the adhesive composition being substantially free of aromatic rings. The polyester polyol is prepared by reacting a poly basic acid and a polyalcohol, and the polybasic acid comprises an aliphatic polybasic acid and/or an alicyclic polybasic acid. The polyester polyol has a glass transition temperature (Tg) in a range of from 0° C. to 10° C. The adhesive composition of the present invention has strong adhesion, excellent weather-resistance and yellowing-resistance.

14 Claims, No Drawings

ADHESIVE COMPOSITIONS, LAYERED ARTICLES AND PHOTOVOLTAIC SHEETS

CROSS REFERENCE TO RELATED APPLICATIONS

This application is a U.S. National Stage Application of International Patent Application No. PCT/IB2022/000530 filed on Sep. 19, 2022, which claims priority to European Patent Application No. 21198596.5, filed on Sep. 23, 2021.

FIELD OF THE INVENTION

The present invention relates to an adhesive composition having durable strong adhesion, excellent weather-resistance and yellowing-resistance. The present invention also relates to a layered article comprising an adhesive layer formed from the adhesive composition, as well as a photovoltaic sheet comprising the layered article.

BACKGROUND

In some outdoor industries such as building materials and solar cells, it is necessary to have an adhesive having durable strong adhesion and excellent weather-resistance. In solar power industry, most of today's solar panels capture sunlight and convert it to electricity only from the side facing the sun. In order to increase the efficiency of the solar panels, some solar cell manufacturer have developed double-sided or bifacial solar panels. For double-sided solar panels, the back sheets also need to be completely transparent. Glass-based front sheets and back sheets have been in use, but they have drawbacks of heavy weight, high transportation cost and high difficulty on installation. People are trying to use fluorine-containing materials (e.g., polyvinylidene fluoride, PVDF) to replace glass in manufacturing of front and back sheets. These plastic photovoltaic sheets are usually composed of various functional layers laminated with adhesives. As an example, one may cite a three-layer structure of PVDF, polyethylene terephthalate (PET) and polyethylene (PE) bonded together by adhesives. However, due to long-time exposure to sunlight, the currently-used adhesives may have yellowing issues and reduce the transparency of the photovoltaic sheets, resulting in an efficiency decrease of the solar cell. There is a need to improve yellowing-resistance of the adhesives and keep high adhesion at the same time.

Yellowing is caused by photo-oxidation or photo-degradation of polymers under ultraviolet (UV) irradiation, which is a common phenomenon especially for those materials with aromatic structures. However, aromatic structures can benefit the adhesion of an adhesive. To meet the adhesion requirement, an adhesive needs to include aromatic structures. For example, the commonly used two-component polyurethane (PU)-based adhesives usually comprise aromatic polyols and aromatic isocyanates.

US 20110104482A1 discloses a two-component PU adhesive for outdoor use that comprises a polyol base material and a polyisocyanate curing agent. The polyol is composed of a polyester polyol and/or polyester polyurethane polyol which is made from a dibasic acid component comprising both an aromatic dibasic acid and an aliphatic dibasic acid, and an aliphatic polyhydric alcohol. U.S. Pat. No. 8,734,943 discloses a resin composition comprising a polyester polyurethane polyol having a branched structure in the molecule thereof and the use of the resin composition in a two-part laminate adhesive with high adhesion to substrates under hot and humid conditions. As disclosed in U.S. Pat. No. 8,734, 943, in the preparation of the polyester polyurethane polyol, a combination of an aliphatic polybasic acid and an aromatic polybasic acid is preferably used so that the resin composition has high adhesion to substrates under hot and humid conditions and viscosity suitable for application. In the two prior arts, as aromatic monomers (e.g., aromatic polybasic acids) are used for preparing the polyol, the prepared adhesives may have yellowing issue under long-time strong UV irradiation.

When applied in a transparent article under UV irradiation, the existing PU-based adhesives could not meet the anti-yellowing requirement as the adhesive layer may become yellow over time. Thus, there is a need to develop an advanced adhesive with improved anti-yellowing performance to address the yellowing issue, while keeping strong adhesive strength.

SUMMARY OF THE INVENTION

The present invention provides an adhesive composition comprising:

a resin component (A) comprising a polyester polyol, a hydrogenated epoxy, a silane, and an optional organic solvent, wherein the polyester polyol is prepared by reacting a polybasic acid and a polyalcohol, the polybasic acid comprises an aliphatic polybasic acid and/or an alicyclic polybasic acid, and wherein the polyester polyol has a glass transition temperature (Tg) in a range of from 0° C. to 10° C.; and a hardener component (B) comprising an aliphatic polyisocyanate and/or an alicyclic polyisocyanate.

The present invention also provides a layered article comprising a first layer and a second layer with an adhesive layer disposed therebetween, wherein at least one of the first and the second layer is a plastic film, a metal foil, an inorganic film, a composite film or combinations thereof, and the adhesive layer is formed from the adhesive composition of the present invention. The plastic film can be made from polyester, polyolefin, polyethylene terephthalate (PET), fluoropolymer, polycarbonate, polystyrene, acrylic resin, epoxy resin, melamine resin, triacetylcellulose resin, polyvinyl alcohol, ABS resin, norbornene resin, cyclic olefin resin, polyimide resin or combinations thereof. The composite film may be formed by two or more materials selecting from polymer, inorganic materials and metal.

The present invention further provides a photovoltaic sheet comprising the layered article according to the present invention, wherein the layered article is transparent as a whole.

The adhesive composition of the present application has strong adhesion and can form an adhesive layer having excellent weather-resistance and yellowing-resistance, so it can be used outdoors without yellowing issue over time. The common knowledge about the preparation of a PU-based adhesive is to use aromatic raw materials to make sure that the PU-based adhesive has required adhesion. Surprisingly, it is discovered in this invention that even only aliphatic and/or alicyclic monomers are used in preparing PU-based adhesives, without usage of aromatic raw materials, the obtained adhesive composition can also have strong adhesive strength. Moreover, as the adhesive composition of the present invention is substantially free of aromatic rings, it has excellent anti-yellowing performance. By "substantially free of aromatic rings", it is intended that advantageously less than 5% by weight of the ingredients of the composition comprise an aromatic ring, based on the total weight of the composition, preferably less than 3% by weight, more preferably less than 1% by weight. Preferably, the adhesive composition of the present invention does not comprise any aromatic ring.

DETAILED DESCRIPTION

The expressions "between . . . and . . . " and "from . . . to . . . " used in the present application should be understood as including each of the mentioned limits.

As used in the present application, the prefix "poly" means optionally more than one, or stated alternatively, two or more. For example, "polybasic acid" means a compound having two or more acid functionalities (e.g., carboxyl). "Polyalcohol" means a compound having two or more hydroxyl groups.

As used in the present application, the term "aliphatic" is used to describe a hydrocarbon compound or a chemical structure which is saturated or unsaturated, straight or branched, and contains no rings of any type. The term "alicyclic" or "cycloaliphatic" is used to describe a hydro-carbon compound or a chemical structure containing at least a ring, but is not aromatic. So in the description of the present application, aliphatic monomers do not comprise alicyclic monomers, and alicyclic monomers do not comprise aliphatic monomers.

As used in the present application, the term "aromatic" is used to describe a hydrocarbon compound or a chemical structure containing benzene which is often drawn as a ring of six carbon atoms with alternating double bonds and single bonds.

In the present specification, the number average molecular weight (Mn) and molecular weight distribution (Mw/Mn) are measured by gel permeation chromatography (GPC).

The embodiments of the present invention include an adhesive composition which comprises a resin component (A) comprising a polyester polyol, a hydrogenated epoxy, a silane, and an optional organic solvent, wherein the polyester polyol is prepared by reacting a polybasic acid and a polyalcohol, the polybasic acid comprises at least one aliphatic polybasic acid and/or at least one alicyclic polybasic acid, and wherein the polyester polyol has a glass transition temperature (Tg) in a range of from 0° C. to 10° C.; and a hardener component (B) comprising an aliphatic polyiso-cyanate and/or an alicyclic polyisocyanate.

As disclosed herein, the polyester polyol may have a Tg ranging from 0° C. to 10° C. If the polyester polyol has a Tg of less than 0° C., the obtained adhesive composition may be tacky after curing. If the polyester polyol has a Tg of greater than 10° C., the obtained adhesive composition may be brittle and have a low bonding strength value (BSV) after curing.

The polyester polyol may have a Mn ranging from 10,000 g/mole to 50,000 g/mole, preferably from 10,000 g/mole to 20,000 g/mole. Because the polyester polyol has a Mn within the above range, the adhesive composition may have a high adhesive strength when cured and suitable viscosity for application. If the polyester polyol has a Mn of less than 10,000 g/mole, the obtained adhesive composition may have decreased adhesive strength and is also difficult to uniformly apply because of its low viscosity. If the polyester polyol has a Mn of more than 20,000 g/mole, the obtained adhesive composition is difficult to apply because of its high viscosity. The polyester polyol may have a molecular weight distri-bution in a range of from 2 to 5, preferably from 2.2 to 3.0.

The polyester polyol may have a hydroxyl value (OHV) ranging from 5 to 15 mg KOH/g, preferably from 8 to 12 mg KOH/g, so that the resin composition can have high adhe-sion to substrates.

The polyester polyol may have an acid value (AV) less than 3 mg KOH/g, preferably less than 1 mg KOH/g.

The polyester polyol may be prepared, for example, by reacting at least one polybasic acid and at least one polyal-cohol. In this case, the polybasic acid may comprise at least one aliphatic polybasic acid and/or at least one alicyclic polybasic acid. The polybasic acid may be substantially free of aromatic polybasic acid, i.e. the polybasic acid advanta-geously comprises less than 5% by weight of aromatic polybasic acid, based on the total weight of the polybasic acid, preferably less than 3% by weight, more preferably less than 1% by weight. Preferably, the polybasic acid does not comprise any aromatic polybasic acid.

The aliphatic polybasic acid may be an aliphatic polybasic acid containing two functionalities (e.g., dibasic acid) and/or an aliphatic polybasic acid having three or more function-alities. When the aliphatic polybasic acid having three or more functionalities is used, a branched structure can be introduced into the molecule of the polyester polyol of the present invention. The aliphatic dibasic acids can be satu-rated dibasic acids or unsaturated dibasic acids. Examples of the aliphatic dibasic acids include malonic acid, succinic acid, glutaric acid, adipic acid, pimelic acid, suberic acid, azelaic acid, sebacic acid, undecanedioic acid, dodecane-dioic acid, tridecanedioic acid, tetradecanedioic acid, pen-tadecanedioic acid, hexadecanedioic acid, heptadecanedioic acid, octadecanedioic acid, nonadecanedioic acid, icosane-dioic acid, maleic acid, fumaric acid, citraconic acid, itaconic acid, glutaconic acid, anhydrides thereof, acid halides thereof, and mixtures thereof. One example of the aliphatic polybasic acid having three or more functionalities is hexane-tricarboxylic acid.

In the present invention, aliphatic polybasic acids having 4 to 20 carbon atoms are preferred, including adipic acid, pimelic acid, suberic acid, azelaic acid, sebacic acid, unde-canedioic acid, dodecanedioic acid, tridecanedioic acid, tetradecanedioic acid, pentadecanedioic acid, hexadecane-dioic acid, heptadecanedioic acid, octadecanedioic acid, nonadecanedioic acid, icosanedioic acid, and hexane-tricar-boxylic acid. More preferred are aliphatic polybasic acids having 8 to 13 carbon atoms, including suberic acid, azelaic acid, sebacic acid, undecanedioic acid, dodecanedioic acid, tridecanedioic acid, and hexane-tricarboxylic acid.

The alicyclic polybasic acid used in this invention includes preferably tetrahydrophthalic acid, hexahydroph-thalic acid, 1,3-cyclohexanedicarboxylic acid, 1,4-cyclo-hexanedicarboxylic acid, 1,2,4-cyclohexanetricarboxylic acid, acid anhydrides thereof, acid halides thereof, and mixtures thereof. In some embodiments of the present invention, monocarboxylic acids may also be used as a raw material in preparation of the polyester polyol to adjust the molecular weight and viscosity of the polyester polyol. Examples of monocarboxylic acids include methanoic acid, ethanoic acid, propanoic acid, butanoic acid, pentanoic acid, hexanoic acid, heptanoic acid, octanoic acid, nonanoic acid, decanoic acid, dodecanoic acid, tetradecanoic acid, hexade-canoic acid, heptadecanoic acid, octadecanoic acid, and benzoic acid.

The aliphatic polybasic acid and the alicyclic polybasic acid may be used alone or in a combination of two. In some embodiments of the present invention, a combination of the aliphatic polybasic acid and the alicyclic polybasic acid is preferably used so that the resin composition can have high adhesion to substrates under hot and humid conditions and viscosity suitable for application. The mole ratio of the aliphatic polybasic acid and the alicyclic polybasic acid may be controlled or adjusted so as to obtain a polyester polyol having a Tg in a range of from 0° C. to 10° C.

In certain embodiments of the present application, the polybasic acid comprises at least one aliphatic polybasic acid and at least one alicyclic polybasic acid.

The polyalcohol used to prepare the polyester polyol may comprise a polyol having two functionalities (e.g., diol) and/or a polyol having three or more functionalities. The polyalcohol may not comprise any aromatic rings.

Examples of diols include aliphatic diols such as ethylene glycol, diethylene glycol, propylene glycol, 1,3-propanediol, 1,2,2-trimethyl-1,3-propanediol, 2,2-dimethyl-3-iso-propyl-1,3-propanediol, 1,4-butanediol, 1,3-butanediol, 3-methyl-1,3-butanediol, 1,5-pentanediol, 3-methyl1,5-pentanediol, neopentyl glycol, 1,6-hexanediol, 1,4-bis(hydroxymethyl)cyclohexane, and 2,2,4-trimethyl-1,3-pentanediol; ether glycols such as polyoxyethylene glycol and polyoxypropylene glycol. Examples of polyols having three or more functionalities include aliphatic polyols such as trimethylolethane, trimethylolpropane, glycerol, hexanetriol, and pentaerythritol. If polyols having three or more functionalities is used, a branched structure can be formed in the molecule of the polyester polyol of the present invention.

These polyalcohols described above may be used alone or in a combination of two or more. In some preferred embodiments, aliphatic diols are used so that the adhesive composition may have higher adhesion to substrates under hot and humid conditions.

The polyester polyol may be prepared, for example, by reacting the polybasic acid with the polyalcohol in the presence of an esterification catalyst in the temperature range of 180° C. to 270° C.

As disclosed above, the polyester polyol of the present application substantially does not contain any aromatic structures, i.e. advantageously less than 5% by weight of the ingredients implemented for preparing the polyester polyol comprise aromatic structures, based on the total weight of said ingredients, preferably less than 3% by weight, more preferably less than 1% by weight. Preferably, the polyester polyol does not contain any aromatic structure. When the polyester polyol is used in resin component (A), the prepared adhesive composition of the present application may have excellent anti-yellowing performance.

Preferably, the polyester polyol of the present application does not comprise any carbamate group (i.e., is not a polyester polyurethane). More preferably, the resin component (A) does not comprise any compound having carbamate groups (i.e., does not comprise any polyurethane, polyester polyurethane, etc.).

To avoid introducing any aromatic structure into the adhesive composition, a hydrogenated epoxy is used in the resin component (A) instead of epoxy resin containing aromatic rings. Therefore, the hydrogenated epoxy used in the resin component (A) does not comprise any aromatic ring. The hydrogenated epoxy used herein may have a Mn ranging from 300 g/mole to 5,000 g/mole, preferably from 400 g/mole to 2,000 g/mole. Examples of the hydrogenated epoxy include Hydrogenated Bisphenol A Epoxy. The hydrogenated epoxy does not comprise any silicon atom and is thus different from an epoxy silane.

The resin component (A) of the present invention further comprises at least one silane. Preferably, the silane does not comprise any aromatic ring. The silane may comprise aminosilane, epoxy silane, vinyl silane, alkyl silane or combinations thereof. Preferably the silane used herein comprises epoxy silane. In a wet and hot environment, the silane will hydrolyze to produce silicon hydroxyls, which can be cross-linked and even react with functional groups in substrate, so it will result in stronger bonding and weather and aging resistance.

The resin component (A) of the present invention may further comprise at least one organic solvent. The organic solvent may comprise an ester solvent, an ether solvent, a ketone solvent, an alcohol solvent or combinations thereof. Examples of the ester solvent include methyl acetate, ethyl acetate, and butyl acetate. Examples of the ester solvent include tetrahydrofuran (THF) and dioxolane. Examples of the ketone solvent include acetone, methyl ethyl ketone (MEK), and methyl isobutyl ketone. Examples of the alcohol solvent include carbitol, cellosolve, methanol, isopropanol, butanol, and propylene glycol monomethyl ether. These examples may be used alone or in a combination of two or more. Preferably, the organic solvent may comprise methyl acetate, ethyl acetate, butyl acetate, acetone, butanone or combinations thereof.

In some preferred embodiments of the present invention, based on the total weight of the resin component (A), the resin component (A) may comprise:
  35-55 wt % of the polyester polyol;
  2-10 wt % of the hydrogenated epoxy;
  0.1-5 wt % of the silane; and
  40-60 wt % of the organic solvent.

The hardener component (B) comprises an aliphatic polyisocyanate and/or an alicyclic polyisocyanate. The hardener component (B) does not comprise an aromatic polyisocyanate, so that the corresponding adhesive composition can be resistant to yellowing.

Examples of the aliphatic polyisocyanate include butane-1,4-diisocyanate, hexamethylene diisocyanate, 2,2,4-trimethylhexamethylene diisocyanate, 2,4,4-trimethylhexamethylene diisocyanate. Examples of the alicyclic polyisocyanate include cyclohexane-1,4-diisocyanate, isophorone diisocyanate (IPDI), lysine diisocyanate, dicyclohexylmethane-4,4'-diisocyanate, 1,3-bis(isocyanatomethyl)cyclohexane, methylcyclohexane diisocyanate, isopropylidenedicyclohexyl-4, 4'-diisocyanate, and norbornane diisocyanate.

In some other embodiments, the aliphatic polyisocyanate and/or an alicyclic polyisocyanate in the hardener component (B) may be polyisocyanate oligomers resulting from oligomerization reactions of aliphatic and/or an alicyclic polyisocyanates. The polyisocyanate oligomers may be dimers and/or trimers. Examples of the polyisocyanate oligomer include hexamethylene diisocyanate (HDI) trimer and HDI dimer.

Preferably, the hardener component (B) comprising a hexamethylene diisocyanate (HDI) trimer, a HDI dimer, a HDI biuret, IPDI, hydrogenated methylenediphenyl diisocyanate (HMDI) or combinations thereof, may be used to prepare the two-component adhesive composition. The hardener component (B) in the adhesive composition of the present invention acts as a curing agent that reacts with the hydroxyl groups contained in the polyester polyol, the hydrogenated epoxy and the silane of the resin component (A).

As discussed above, the adhesive composition of the present invention is a two-component composition, which comprises, as essential components, a resin component (A) comprising a polyester polyol, a hydrogenated epoxy and a silane; and a hardener component (B) comprising an aliphatic polyisocyanate and/or an alicyclic polyisocyanate. In the present invention, the weight ratio of the resin component (A) and the hardener component (B) is designed or calculated based on the mole ratio [OH]/[NCO] of the number of moles [OH] of hydroxyl groups contained in the polyester polyol to the number of moles [NCO] of isocyanate groups contained in the polyisocyanate. The mole ratio [OH]/[NCO] may be controlled in a specific range, so as to obtain an adhesive composition having strong adhesion and can form an adhesive layer having excellent weather-resistance and yellowing-resistance. In some embodiments of the present application, the mole ratio [OH]/[NCO] is in a range of from 1:2 to 1:4, preferably in a range of from 1:2.5 to 1:4.

In some embodiments of the present invention, the adhesive composition may further comprise various additives such as ultraviolet absorbers, antioxidants, silicon-based additives, fluorinated additives, rheology control agents, defoaming agents, antistatic agents, and antifogging agents.

The embodiments of the present invention further include a layered article which comprises a first layer and a second layer with an adhesive layer disposed therebetween, wherein at least one of the first layer and the second layer is a plastic film, a metal foil, an inorganic film, a composite film or combinations thereof, and the adhesive layer is made from the adhesive composition of the present invention.

The plastic film may be made from polyester, polyolefin, polyethylene terephthalate (PET), fluoropolymer, polycarbonate, polystyrene, acrylic resin, epoxy resin, melamine resin, triacetylcellulose resin, polyvinyl alcohol, ABS resin, norbornene resin, cyclic olefin resin, polyimide resin, or combinations thereof. Examples of polyolefin include polyethylene (PE) and polypropylene (PP). Examples of fluoropolymer include polyvinyl fluoride (PVF), polyvinylidene fluoride (PVDF), polytetrafluoroethylene (PTFE), and terpolymers of tetrafluoroethylene, hexafluoropropylene and vinylidene fluoride. Examples of acrylic resin include polymethyl methacrylate (PMMA).

In the present application, a plastic film made of fluoropolymer is often used since fluoropolymer usually has excellent chemical and physical inertness, as well as excellent barrier properties and hydrophobic characteristics. As a result, the plastic film made of fluoropolymer may have excellent weather-resistance and high thermal stability. However, fluoropolymer-based materials inherently have low surface energy and suffer from poor adhesion to dissimilar materials, making it difficult to form laminates. Surprisingly, it is found that the adhesive composition of present application have high adhesion to a plastic film made of fluoropolymer.

In some embodiments of the present application, at least one of the first layer and the second layer of the layered article is made from fluoropolymer. In some other embodiments, both the first layer and the second layer of the layered article are made from fluoropolymer.

The layered article of the present application may comprise three or more layers, and at least two adjacent layers are bonded together by the adhesive composition of the present application. In some embodiments, every two adjacent layers are bonded together by the adhesive composition of the present application.

When the adhesive composition of the present application is applied in the layered article, the adhesive composition may be used in an amount of 5 to 15 g/m², preferably in an amount of 8 to 12 g/m².

In some embodiments, the layered article may be prepared by a process comprising the following steps: applying the adhesive composition of the present application on one side of a first layer; laminating a second layer on the first layer with the adhesive composition disposed between the first layer and the second layer, to obtain a laminate; and placing the laminate in an oven of 60° C. for 5 to 7 days. Thus the layered article is obtained.

Due to high adhesion of the adhesive composition, the layered article of the present application can be used in outdoor environments and the bonded layers do not peel off easily. In some embodiments, at least one of the first layer and the second layer of the layered article is transparent. In some other embodiments, the layered article of the present application is transparent as a whole. In some applications, the layered article needs to keep transparent in outdoor environment and/or UV light irradiation. An example of such application includes front sheet or back sheet for solar cell panels (i.e., photovoltaic sheet). In such a case, each of the layers comprised in the layered article may be transparent. As the adhesive composition of the present application has excellent weather resistance and yellowing resistance, the layered article can keep transparent without becoming yellow after long time UV light.

The embodiments of the present invention further include a photovoltaic sheet comprising a layered article according to the present invention, wherein the layered article is transparent.

As used in the present application, photovoltaic sheet can be a front sheet or a back sheet of a solar cell panel. Both the front sheet and the back sheet are used to protect the cells in the middle. The front sheet faces the sunlight and need to be transparent. The back sheet usually faces the ground. For one-sided solar panels, there is no transparency requirement for back sheet, but for double-sided solar panels, the back sheet is also transparent.

In some embodiments of the present application, the photovoltaic sheet may comprise a transparent three-layer structure of PVDF/PET/PE or PVDF/PET/PVDF. As disclosed herein, "/" refers to an adhesive layer formed by the adhesive composition of the present application. With the adhesive composition of the present application, the photovoltaic sheet can have good bonding strength among layers before and after ageing, excellent anti-yellowing performance after UV ageing. When the photovoltaic sheet of the present application is used in a solar cell or solar panel, the efficiency of the solar cell can be kept at a high level even after year-by-year UV irradiation. In addition, comparing with glass-made photovoltaic sheets, photovoltaic sheets of the present applicant provide advantages of easy transportation and installation due to the light weight.

EXAMPLES

The present invention is further illustrated by the following specific examples of synthesis and implementation, though the present invention is not limited thereto.

Test Methods

Mn and Mw/Mn: measured by gel permeation chromatography (GPC) (apparatus: Waters alliance e2695; detector: Waters refractometer 410/Waters UV detector W2489; column temperature: 35° C.; solvent: HPLC grade THF; flow rate 1 ml/min; injection volume: 50 μl)

Acid value (AV): tested by titration method with reference to HG/T 2708-1995.

Hydroxyl value (OHV): tested by titration method with reference to DIN standard 53240-2-2017.

Tg: tested using DSC (apparatus: TA Q2000. A heat/cool/reheat profile was used. The units with sample and reference were cooled down to −80° C. at first, then heated from −80°

C. to 200° C. at 20° C./min rate (1st cycle). Later, the units were cooled from 200° C. to −80° C. at 20° C./min (2nd cycle) and then heated from −80° C. to 200° C. at 20° C./min (3rd cycle))

Adhesive force or bonding strength: a laminated article was prepared by bonding two layers with an adhesive composition. The adhesive force of the adhesive composition was evaluated by a peeling test using a tensile testing machine (MTS CMT6103), where the strength was measured in N/10 mm at a peel speed of 100 mm/min and an angle of 180°. Besides the bonding strength values, "tacky", "film broken (FB)" and "zipping" are also used to describe the testing results. "Tacky" means the adhesive is tacky after curing and the result is not good. "Film broken (FB)" means film broken and the result is good. "Zipping" means bonding strength fluctuation is large and the result is not good.

Three aging tests (i.e., Aging Test 1, Aging Test 2 and UV Test) were conducted to test an adhesive force and yellowing $\Delta b$ value of an adhesive composition after it was exposed to a hot and humid environment. The specific environmental requirements of each aging test was shown below. The adhesive force after exposure was measured in N/10 mm using the method described above. The yellowing $\Delta b$ value was tested using BYK spectro-guide.

Aging Test 1:85° C., relative humidity of 85%, 2000 h;
Aging Test 2:121° C., relative humidity of 100%, 2 bar, 96 h;
UV Test: 60° C., 280-400 nm length ultraviolet radiation, 180 KW·h/m².

Raw Materials

The information of the raw materials used in Examples is shown in Table 1.

TABLE 1

| # | Raw material | Source |
|---|---|---|
| 1 | Hexahydrophthalic anhydride (HHPA) | Puyang Huicheng Electronic Materials CO., Ltd. |
| 2 | 1,4-Cyclohexanedicarboxylic acid (CHDA) | SK Chemical |
| 3 | Sebacic acid (SA) | Arkema |
| 4 | Neopentyl glycol (NPG) | Perstorp |
| 5 | Ethylene glycol (EG) | Suzhou Boyang Chemical Co., Ltd. |
| 6 | Methyl pentanediol (MPO) | Taiwan Dalian Chemical |
| 7 | 1,6-hexanediol (HDO) | Zhejiang Boju New Materials Co., Ltd. |
| 8 | Hydrogenated epoxy | ADEKA 4080E |
| 9 | Epoxy silane | Evonik |
| 10 | HDI trimer | Covestro |

Preparation of Polyester Polyol (from PE-1 to PE-8)

248 parts of HHPA, 240 parts of CHDA, 122 parts of SA, 43 parts of EG and 347 parts of NPG were charged into a reactor equipped with stirrer, condenser and thermometer, tetrabutyl titanate (Tnbt) and then a transesterification reaction was carried out at a temperature ranging from 220-250° C. for ten hours. After that, a polycondensation reaction was carried out at 240-250° C. under 900 Pa vacuum for 20 hours. The first polyester polyol (PE-1) was thus obtained.

Each of polyester polyols 2-8 (i.e., PE-2 to PE-8) was prepared with the same method as PE-1 with the raw material amounts shown in Table 2.

The physical properties of each PE including number-average molecular weight (Mn, Mw/Mn, OHV, AV and Tg were measured and shown in Table 2.

Preparation of Adhesive Compositions (Examples 1-5 and Comparative Examples A to E)

Example 1: an adhesive composition was prepared by mixing component A and component B, wherein the component A comprised 100 parts by mass of PE-1 prepared above, 10 parts by mass of hydrogenated epoxy, 1 part by mass of epoxy silane, and 111 parts by mass of EA, the component B comprised 100 parts by mass of HDI-trimer which was used as hardener. An adhesive composition is thus obtained.

In each of Examples 2-5 and Comparative Examples A to E, the adhesive composition was prepared with the same method of Example 1 with the raw material amounts shown in Table 3.

Preparation of Layered Articles

For each of the adhesive compositions prepared in Examples 1-5 and Comparative Examples A to E, a layered article was prepared based on the following procedures. The adhesive composition was applied to a 250 μm thick PET film in a coating amount of 8 g/m², and then a 25 μm thick PVDF film was laminated on the PET film to obtain a layered article.

Each of the layered articles prepared with the adhesive compositions prepared in Examples 1-5 and Comparative Examples A to E was subjected to a peeling test to measure initial adhesive force, Aging Test 1, Aging Test 2 and UV Test to measure bonding strength after exposure and yellowing $\Delta b$ value of the corresponding adhesive composition. The testing results were shown in Table 3.

As shown in Table 3, the adhesive compositions of Examples 1-3 and Comparative Examples A to E were prepared with the same method and same mole ratio of [OH]/[NCO], but with an only difference on polyester polyol. When a polyester polyol having a Tg in the range of from 0° C. to 10° C. was used to prepare an adhesive composition (Examples 1-3), the resulting adhesive compositions had good initial adhesive force, good after-exposure adhesive force and anti-yellowing performance.

As shown in Table 3, the adhesive compositions of Examples 4 and 5 were prepared with the same method and same raw materials (i.e., PE-2 and HDI trimer), but having different mole ratios of [OH]/[NCO]. The resulting adhesive compositions had good initial adhesive force, good after-exposure adhesive force and anti-yellowing performance.

Preparation of Transparent Photovoltaic Sheets

A transparent photovoltaic back sheet was prepared based on the following procedures. The adhesive composition prepared in Example 2 was applied to a first side of a 250 μm thick PET film in a coating amount of 8 g/m², to form a first adhesive layer, and then a 25 μm thick PVDF film was laminated on the PET film with the first adhesive layer disposed therebetween. Next, the adhesive composition prepared in Example 2 was applied to a second side of the 250 μm thick PET film in a coating amount of 8 g/m², to form a second adhesive layer, and then a 40 μm thick PE film was laminated on the PET film with the second adhesive layer disposed therebetween. Thus a transparent photovoltaic back sheet was prepared.

TABLE 2

|  |  | PE-1 | PE-2 | PE-3 | PE-4 | PE-5 | PE-6 | PE-7 | PE-8 |
|---|---|---|---|---|---|---|---|---|---|
| Raw Materials (Content in parts by mass) | HHPA | 248 | 258 | 258 | 285 | 313 | 128 | 128 | 128 |
|  | CHDA | 240 | 240 | 240 | 267 | 292 | 287 | 287 | 287 |
|  | SA | 122 | 112 | 112 | 56 | / | 185 | 185 | 185 |
|  | EG | 43 | 10 | / | 12 | 15 | 30 | / | 43 |
|  | NPG | 347 | 380 | 380 | 380 | 380 | 270 | 357 | 357 |
|  | MPO | / | / | 10 | / | / | / | 43 | / |
|  | HDO | / | / | / | / | / | 100 | / | / |
| Physical Properties | Mn | 12,189 | 14,474 | 16,879 | 13,088 | 12,680 | 15,256 | 13,541 | 12,258 |
|  | Mw/Mn | 2.9 | 2.8 | 2.9 | 2.7 | 2.8 | 2.9 | 2.8 | 2.8 |
|  | OHV | 11.9 | 9.7 | 8.7 | 10.8 | 11.5 | 9.2 | 10.5 | 11.7 |
|  | AV | 0.5 | 0.7 | 0.4 | 0.7 | 0.5 | 0.6 | 0.4 | 0.5 |
|  | Tg (° C.) | 3.32 | 8.45 | 9.04 | 15.18 | 27.06 | −12.14 | −20.51 | −21.23 |

TABLE 3

|  |  | Ex. 1 | Ex. 2 | Ex. 3 | Ex. 4 | Ex. 5 | Ex. A (comp.) | Ex. B (comp.) | Ex. C (comp.) | Ex. D (comp.) | Ex. E (comp.) |
|---|---|---|---|---|---|---|---|---|---|---|---|
| Raw Materials (Content in parts by mass) | PE | PE-1 | PE-2 | PE-3 | PE-2 | PE-2 | PE-4 | PE-5 | PE-6 | PE-7 | PE-8 |
|  |  | 100 | 100 | 100 | 100 | 100 | 100 | 100 | 100 | 100 | 100 |
|  | Hydrogenated Epoxy | 10 | 10 | 10 | 10 | 10 | 10 | 10 | 10 | 10 | 10 |
|  | Silane | 1 | 1 | 1 | 1 | 1 | 1 | 1 | 1 | 1 | 1 |
|  | Ethyl acetate | 111 | 111 | 111 | 111 | 111 | 111 | 111 | 111 | 111 | 111 |
|  | HDI Trimer | 8 | 8 | 8 | 6 | 4 | 8 | 8 | 8 | 8 | 8 |
| [OH]/[NCO] |  | 1:4 | 1:4 | 1:4 | 1:3 | 1:2 | 1:4 | 1:4 | 1:4 | 1:4 | 1:4 |
| Initial Adhesive Force (N/10 mm) |  | 5.8 | 6 | 6 | 5.76 | 5.64 | 5.1 | <1 | 5.3 | 5.5 | 5.6 |
|  |  | FB | FB | FB | FB | Little Tacky | Zipping |  | Tacky | Tacky | Tacky |
| Aging Test 1 | Adhesive Force (N/10 mm) | 6.1 | 5.9 | 6.2 | >6 | 5.5 | 4.2 | <1 | 5.9 | 6.1 | 6.0 |
|  |  | FB | FB | FB | FB | Little Tacky | Zipping |  | Tacky | Tacky | Tacky |
|  | Δb | 0.6 | 0.7 | 0.5 | 0.8 | 0.6 | 0.5 | 0.6 | 0.5 | 0.7 | 0.7 |
| Aging Test 2 | Adhesive Force (N/10 mm) | 5.9 | 6.3 | 6.1 | >6 | 5.7 | 3.8 | <1 | 5.4 | 5.6 | 5.5 |
|  |  | FB | FB | FB | FB | Little Tacky | Zipping |  | Tacky | Tacky | Tacky |
|  | Δb | 0.7 | 0.6 | 0.6 | 0.5 | 0.6 | 0.4 | 0.5 | 0.6 | 0.8 | 0.6 |
| UV Test | Δb | 1.2 | 1.1 | 1.1 | 1.0 | 1.3 | 1.0 | 1.3 | 1.1 | 1.1 | 1.3 |

The invention claimed is:

1. An adhesive composition comprising:
a resin component (A) comprising a polyester polyol, a hydrogenated epoxy, a silane, and an optional organic solvent, wherein the polyester polyol is prepared by reacting a polybasic acid and a polyalcohol, the polybasic acid comprises an aliphatic polybasic acid and/or an alicyclic polybasic acid, and wherein the polyester polyol has a glass transition temperature (Tg) in a range of from 0° C. to 10° C.; and
a hardener component (B) comprising an aliphatic polyisocyanate and/or an alicyclic polyisocyanate;
wherein the adhesive composition is substantially free of aromatic rings.

2. The adhesive composition according to claim 1, wherein a mole ratio [OH]/[NCO] of the number of moles [OH] of hydroxyl groups contained in the polyester polyol to the number of moles [NCO] of isocyanate groups contained in the aliphatic polyisocyanate and/or the alicyclic polyisocyanate is in a range of from 1:2 to 1:4.

3. The adhesive composition according to claim 1, wherein the polyester polyol has a number average molecular weight (Mn) ranging from 10,000 g/mole to 50,000 g/mole.

4. The adhesive composition according to claim 1, wherein the polyester polyol has a hydroxyl value ranging from 5 to 15 mg KOH/g.

5. The adhesive composition according to claim 1, wherein the polybasic acid comprises at least one aliphatic polybasic acid and at least one alicyclic polybasic acid.

6. The adhesive composition according to claim 1, wherein the silane comprises aminosilane, epoxy silane, vinyl silane, or alkyl silane or combinations thereof.

7. The adhesive composition according to claim 1, comprising an organic solvent, wherein the organic solvent comprises an ester solvent, an ether solvent, a ketone solvent, or an alcohol solvent or combinations thereof.

8. The adhesive composition according to claim 1, wherein based on a total weight of the resin component (A), the resin component (A) comprises:
35-55 wt % of the polyester polyol;
2-10 wt % of the hydrogenated epoxy;
0.1-5 wt % of the silane; and
40-60 wt % of the organic solvent.

9. The adhesive composition according to claim 1, wherein the hardener component (B) comprises a hexamethylene diisocyanate (HDI) trimer, a HDI dimer, a HDI biuret, isophorone diisocyanate (IPDI), or hydrogenated methylenediphenyl diisocyanate (HMDI) or combinations thereof.

10. A layered article comprising a first layer and a second layer with an adhesive layer disposed therebetween, wherein at least one of the first and the second layer is a plastic film, a metal foil, an inorganic film, or a composite film or combinations thereof, and the adhesive layer is formed from the adhesive composition according to claim 1.

11. The layered article according to claim 10, wherein at least one of the first and the second layer is a plastic film made from polyester, polyolefin, polyethylene terephthalate (PET), fluoropolymer, polycarbonate, polystyrene, acrylic resin, epoxy resin, melamine resin, triacetylcellulose resin, polyvinyl alcohol, ABS resin, norbornene resin, cyclic olefin resin, polyimide resin or combinations thereof.

12. The layered article according to claim 10, wherein at least one of the first layer and the second layer is made of fluoropolymer.

13. The layered article according to claim 10, wherein at least one of the first layer and the second layer is transparent.

14. A photovoltaic sheet comprising the layered article according to claim 10, wherein the layered article is transparent as a whole.

\*   \*   \*   \*   \*